United States Patent [19]
Hierold et al.

[11] Patent Number: 5,834,332
[45] Date of Patent: Nov. 10, 1998

[54] MICROMECHANICAL SEMICONDUCTOR COMPONENTS AND MANUFACTURING METHOD THEREFOR

[75] Inventors: Christofer Hierold; Thomas Scheiter, both of Munich; Markus Biebl, Augsburg; Helmut Klose, Munich, all of Germany

[73] Assignee: Siemens Aktiengesellschaft, Munich, Germany

[21] Appl. No.: 935,384

[22] Filed: Sep. 23, 1997

Related U.S. Application Data

[62] Division of Ser. No. 616,629, Mar. 15, 1996, Pat. No. 5,760,455.

[30] Foreign Application Priority Data

Mar. 17, 1995 [DE] Germany .................. 195 09 868.4

[51] Int. Cl.⁶ .................................................. H01L 21/00
[52] U.S. Cl. ............................................... 438/48; 438/52
[58] Field of Search .......................... 438/48, 50, 51, 438/52

[56] References Cited

U.S. PATENT DOCUMENTS

| | | | |
|---|---|---|---|
| 5,130,276 | 7/1992 | Adams et al. ...................... | 438/52 |
| 5,164,328 | 11/1992 | Dunn . | |
| 5,258,097 | 11/1993 | Mastrangelo . | |
| 5,324,683 | 6/1994 | Fitch et al. . | |
| 5,326,726 | 7/1994 | Tsang et al. ...................... | 438/52 |
| 5,616,523 | 4/1997 | Benz et al. ...................... | 438/52 |
| 5,656,512 | 8/1997 | Beltman ............................ | 438/52 |

FOREIGN PATENT DOCUMENTS

| | | |
|---|---|---|
| 679 878 | 11/1995 | European Pat. Off. . |
| 6-283528 | 10/1994 | Japan . |

OTHER PUBLICATIONS

W. Kuehnel et al., "A Surface Micromachined Silicon Accelerometer with On–Chip Detection Circuitry", 8253a Sensors and Actuators—A Physical, A4 (1994) Oct., No. 1, Lausanne, CH, pp. 7–16.

B. Puers et al., "Extremely Miniaturized Capacitive Movement Sensors Using New Suspension Systems", 8253a Sensors and Actuators—A Physical, A41 (1994) Apr. 1, Nos. 1/3, Lausanne, CH pp. 129–135.

Primary Examiner—Kevin Picardat
Attorney, Agent, or Firm—Hill & Simpson

[57] ABSTRACT

A component having a movable micro mechanical function element arranged in a cavity having a cover layer supported by webs or pillar-like supports is provided. The movable element is potentially covered with a termination layer for closing the etching holes present in the cover layer. Electrical terminals of the movable part, the cover layer and doped regions produced in the substrate as a cooperating electrode enable the realization of an acceleration sensor that is easy to mount in a housing.

8 Claims, 5 Drawing Sheets

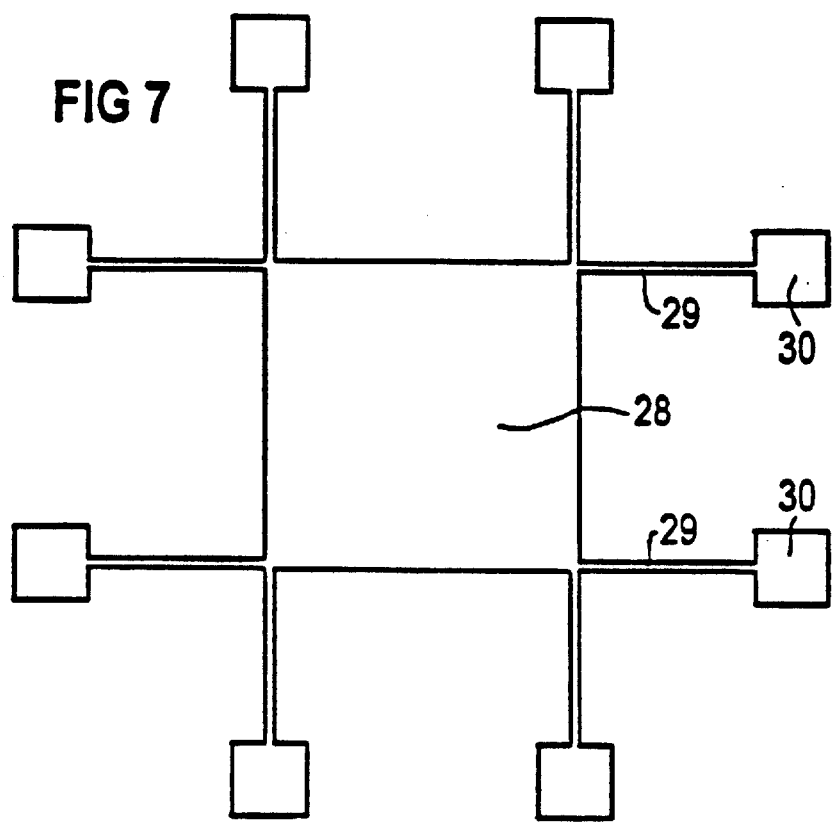
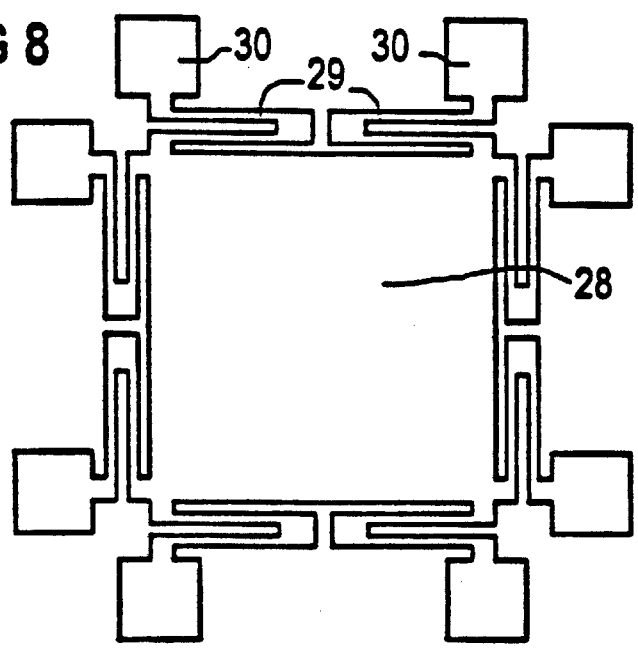

MICROMECHANICAL SEMICONDUCTOR COMPONENTS AND MANUFACTURING METHOD THEREFOR

This is a division, of application Ser. No. 08/616,629, filed Mar. 15, 1996 now U.S. Pat. No. 5,760,455.

BACKGROUND OF THE INVENTION

1. Field of the Invention

The present invention is directed generally to semiconductors and more specifically to a micro mechanical semiconductor component, for example, an acceleration sensor. An associated manufacturing method is also provided.

2. Description of the Related Art

Micromechanical components that are to be utilized as sensors or actuators require micromechanical components that are movably attached to an upper side of the semiconductor substrate. In order to be able to carry out their function, these movable components must be adequately protected against external influences. To this end, such components are provided, for example, in a housing. It is not possible to embed the components in plastic like electronic integrated circuits, for example, like in an injection molding process. Acceleration sensors have hitherto been packaged in expensive ceramic or metallic housings. In this case, the costs of the system are essentially defined by the costs of the housing and the assembly.

WO 95/09366 discloses a method for the manufacture of an acceleration sensor. A part of the layer in which a movable part is fashioned is arranged between remnants of insulating layers used in the manufacture to support a cover layer.

SUMMARY OF THE INVENTION

An object of the present invention is to provide a micromechanical component, particularly as a sensor/actuator, that can be integrated with electronic components in a simple way, especially within the framework of a CMOS process, and that can be simply assembled. Further, manufacturing methods are also provided.

This object is inventively achieved in a micromechanical semiconductor component having a substrate with an upper side. A movable element is constructed as a layer and arranged above the upper side of the substrate. The movable element has a mobility range. A cover layer is located at that side of the movable element that faces away from the substrate. A cavity having lateral walls is located between the cover layer and the upper side of the substrate. The cavity has dimensions to accommodate the mobility range for the movable element. Support means, located at the cavity between the cover layer and the substrate, for supporting the cover layer are also provided.

The present invention also provides a method for manufacturing a micromechanical semiconductor component having a movable element with a mobility range on a substrate. The method has the steps of:

a) producing an auxiliary layer of a material suitable for a subsequent etching at an upper side of the substrate;

b) applying a structure layer provided for the movable element and structuring the structure layer using a mask, the structuring including producing etching holes in the structure layer;

c) covering the structure layer with a further auxiliary layer of a material suitable for the subsequent etching;

d) producing openings in the further auxiliary layer using a mask;

e) filling said openings with material to form a support means;

f) depositing and structuring a cover layer, the structuring including producing etching holes in the cover layer; and g) performing an etching using the etching holes in the cover layer and in the structure layer to remove material of the auxiliary layer and the further auxiliary layer to such an extent to produce a cavity to accommodate the mobility range of the movable element.

The present invention makes it possible to arrange a movable micromechanical element (for example, a mass part, cantilever or the like) in a cavity with a pressure-stable covering on the upper side of the substrate. The component with the covering of the micromechanical element is arranged in the upper structure layers of the chip and can be manufactured within the framework of the manufacturing process that is also provided for the manufacture of further components, for example electronic drive components or micromechanical sensors/actuators.

In the inventive component, this movable element is located above the upper side of a substrate or a layer structure of semiconductor material. A cover layer that is supported on pillar-like supports or webs on the substrate surface is present on that side of the movable element—preferably arranged layer-like—that faces away from the substrate or the layer structure. A cavity is located between this cover layer and the substrate. The cavity is dimensioned such that the movable element can move to the extent necessary to perform its function. The pillar-like or column-like supports provided for supporting this cover layer can also be present in the region of the movable element. Corresponding holes or recesses are then present (for example, etched) in the movable element. These holes or recesses have such a size that the supports not only fit through, but such that the required mobility of the movable element is not vitiated. An entire grid of individual supports for the cover layer can thus be situated in the cavity.

A simple manufacturability of this arrangement results because via hole fills can be used for the supports. Via holes for the electrical connection of individual components are produced in a layer that, for example, is composed of dielectric. As usual, these via holes are filled with the metal provided for the metallization. In a corresponding way, holes like these via holes can be produced in this dielectric layer at the places provided for the supports or pillars, and this can even occur in the same process. The same material that is provided for the via hole fills can also be used for the supports of the cover layer. After the removal of the dielectric layer in the region provided for the movable element, the mobility of this part results in the cavity between the substrate and the cover layer that is produced in this way. The inventive structure of the component can therefore be integrated in a simple way in a process that is provided for the manufacture of electronic components. Exemplary embodiments that are described in detail with reference to FIGS. 1–11 illustrate the invention.

BRIEF DESCRIPTION OF THE DRAWINGS

FIGS. 7–10 illustrate various structures of movable components that are especially suitable for an inventively structured acceleration sensor.

DETAILED DESCRIPTION OF THE PREFERRED EMBODIMENTS

Figure 1:
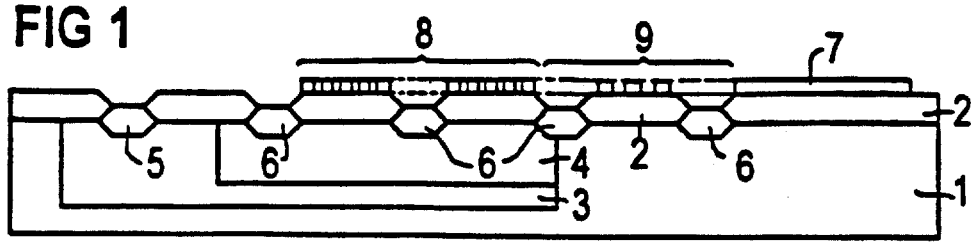
FIGS. 1–3 illustrate intermediate products of the inventive component in crosssection after various stages of the manufacturing method of the present invention.

For the sake of simplicity, the details of the inventive component for preferred embodiments are described below with reference to the associated manufacturing method. A substrate 1 that, for example, can be silicon, is shown in FIG. 1. A semiconductor wafer or a semiconductor structure in general is to be understood as substrate in the following specification and in the claims. An auxiliary layer 2 is produced on this substrate 1. The auxiliary layer 2 can be a separately applied layer or can be formed by a layer portion situated at the upper side of the substrate 1. When the substrate is silicon, the auxiliary layer 2 is expediently produced by local oxidation of an upper layer portion of the silicon (LOCOS). Regions are excluded from this oxidation; the regions are shielded, for example, by using a mask. A structure layer 7 is provided for a movable element 8 to be manufactured. For example, the structure layer 7 can be crystalline silicon or polysilicon. Also, for example, the structure layer 7 can be deposited simultaneously with a layer that is provided for electrodes of electronic components that are integrated together with the micromechanical component. The structure layer 7 is deposited in the region of this movable element 8.

Given the exemplary embodiment described here, doped regions of an acceleration sensor, for example, are formed in the substrate 1. The substrate 1 and indicated insulating regions 6 are doped for electrical conductivity of a first conductivity type. Illustrated doped regions 3 and 4 and contact region 5 adjoining lower doped region 3 are doped for electrical conduction of the operational sign opposite the substrate. Upper doped region 4 is provided as cooperating electrode for the movable sensor element 8 that is to be manufactured electrically conductive. The contact region 5 and the lower region 3 are preferably more highly doped than the electrode region 4. The lower region 3 is, for example, a buried layer ($n^+$ buried layer), the electrode region 4 is an n-well (tub) and the contact region 5 is an $n^+$ terminal implantation. The insulating regions 6 insulate the structures to be applied thereon from the electrode region 4. In alternative embodiments, i.e. given inventive components that are differently structured or provided for different functions, the doped regions in the substrate can be omitted or can be differently structured. After the structure layer 7 has been applied, it is structured. The movable element 8 provided for the sensor having a plurality of etched holes is provided. Spring-like stays 9 provided for fastening the movable element 8 are produced. A portion provided for the fastening to the substrate 1 and for the electrical connection are produced. The structure layer 7 is removed over the insulating regions 6 that are present in recesses of the auxiliary layer 2 as shown in FIG. 1.

A planarizing, further auxiliary layer composed of, for example, a dielectric is then applied surface-wide on the upper side. The material of this further auxiliary layer is selected such that it can be selectively removed relative to the material of the structure layer 7, for example by etching. The openings for contacts and for the intended, pillar-like supports or webs are produced in this further auxiliary layer. These openings are then filled with the material provided therefor. It is advantageous when the same metal is used for via hole fillings and for the webs or supports.

The via hole filling 10 (see FIG. 2) is provided for the electrical connection of the electrode region 4. A via hole filling 13 is also provided for the electrical connection of the electrically conductive, movable element 8 (potentially doped electrically conductive given, for example, silicon). Also, webs 11 or pillar-like supports 12 provided for the support of the cover layer are produced in this way.

The first metallization level provided for the electrical connection can then be applied. This level is composed, in this exemplary embodiment, of a portion 14 applied on the via hole filling 10, a further portion 16 applied on the via hole filling 13 land a cover layer 15. Alternatively, the cover layer 15 can be manufactured of semiconductor material, for example silicon, or of a metal differing from the first metallization level. However, it is advantageous for simplifying the manufacturing method when the metal of the first metallization level that is provided for the electrical connection of the integrated electronic components is used for the cover layer 15.

Figure 2:
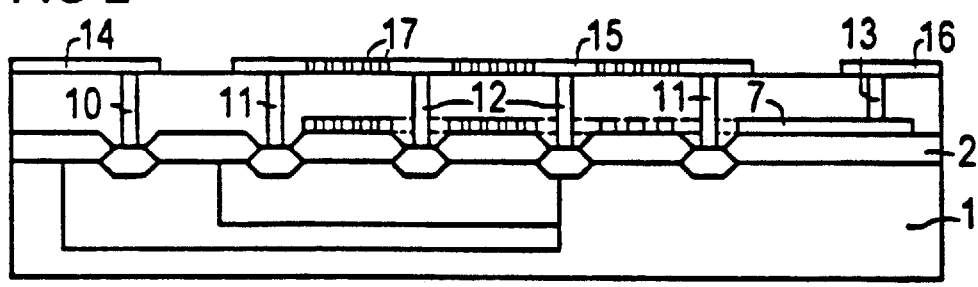

As indicated in FIG. 2, several etching holes 17 are etched in the cover layer 15. In the region of the movable element 8 to be manufactured, the structure layer 7 likewise has holes provided as etching openings that are produced during the structuring. By using the etching openings in the structure layer 7 and the cover layer 15, the material of the auxiliary layer 2 and a further auxiliary layer 20 in the region between the substrate 1 and the cover layer 12 can then be selectively removed relative to the material of the structure layer 7 to such an extent that the portion of the structure layer 7 provided for the movable part 8 is uncovered. It is advantageous when the webs 11 that are provided for the support of the cover layer 15 are present all around the cavity to be produced, so that the material of the further auxiliary layer 20 located in the region outside the cavity to be produced is protected by this surrounding web 11 when the movable element 8 is etched free.

Figure 3:
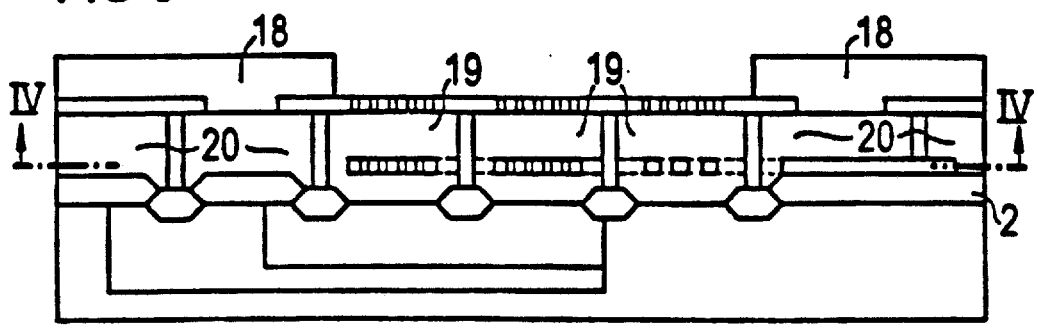

The remaining regions can be protected by a mask 18 when etching the cavity 19 under the cover layer 15, as shown in FIG. 3. The cavity 19 that is limited at its lateral walls by the webs 11 is thus obtained between the substrate 1 and the cover layer 15. The portion of the auxiliary layer 2 and the further auxiliary layer 20 that remain are now only present laterally from this cavity 19. For illustration, the limits of the structure layer 7 that are displaced toward the back out of the plane of the drawing are shown with broken lines in the drawings. The section indicated in FIG. 3 in the layer plane of the structure layer 7 in which the movable element 8 is now manufactured is shown in FIG. 4.

Figure 4:
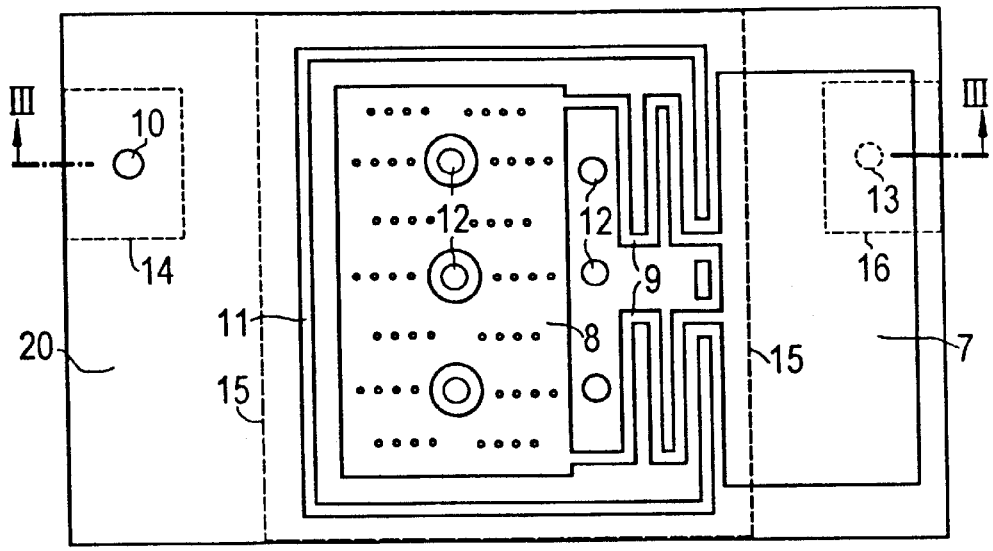
FIG. 4 illustrates the section shown in FIG. 3.

FIG. 4 shows the structure layer 7 with the movable element 8 and the stays 9 that are structured in a meandering pattern. The etching holes in the movable element 8 are indicated with small circles. The pillar-like supports 12 for supporting the cover layer 15 are arranged in recesses of the movable element 8 and between the movable element 8 and the stays 9. Webs 11 are present all around the movable element 8 and the stays 9 and are punctured only for the connection of the stays 9 to the portion of the structure layer 7 secured on the substrate 1. The via hole filling 10 in the plane of the structure layer 7 is also shown. The via hole filling 13, the portions 14,16 of the first metallization level and the edge of the cover layer 15 are shown with broken lines since they are covered contours. In the section shown in FIG. 4, the cover layer 15 is visible in the region between the webs 11 and the portions of the structure layer 7 because of the existing cavity. For the sake of clarity, however, the etching holes present in the cover layer 15 in this region are not shown.

In an inventive acceleration sensor, the cover layer 15 composed of metal or of an electrically conductively doped semiconductor material can function as an upper cooperating electrode for the movable element 8, which is likewise electrically conductive. For example, the cover layer 15 is made of metal or is electrically conductively doped at least in regions thereof and is provided with an electrical terminal, the latter not being shown in the Figures.

Figure 5:
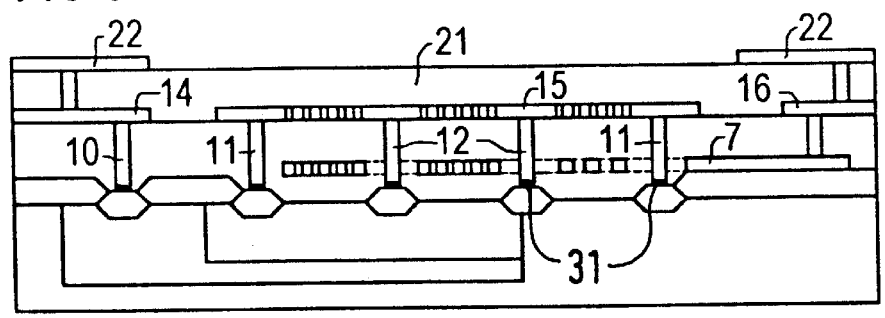
FIG. 5 illustrates an inventive component of the present invention in crossection.

A finished component is shown in crossection in FIG. 5, whereby the cover layer 15 is upwardly covered by a termination layer 21. The termination layer 21 also closes the etching holes that are present in the cover layer 15. Via holes can again be produced and filled with metallizations in the termination layer 21 that, for example, can again be a dielectric. A further metallization level 22 can be applied on the upper side of the termination layer 21. Further, supplementary layer structures can then also be produced on the upper side.

Figure 6:
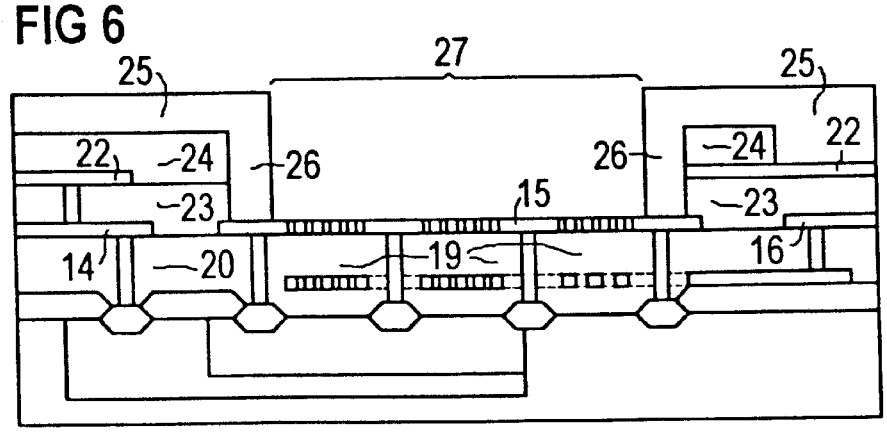
FIG. 6 illustrates a crossection through an inventive component for explaining an alternative step of the manufacturing process of the present invention.

The etching of the cavity 19 can also occur after further metallization levels have been applied on the component. FIG. 6 shows such a structure wherein a dielectric layer 23, the further metallization level 22 and a further dielectric layer 24 are produced on the upper side of the component in order, for example, to produce the provided, electrical connections of the various components integrated in the chip. This layer structure on the upper side of the cover layer 15 can then be removed in the region of the movable element 8 to be etched free, so that the surface of the cover layer 15 is uncovered in the illustrated opening 27. The etching of the opening 27 expediently occurs by using a mask 25 having lateral portions 26 in the embodiment illustrated in FIG. 6 that protect the dielectric layers 23,24 on the upper side of the component against the etching attack during an etching step for manufacturing the cavity 19. The use of mask techniques and the alignment of the various masks to be used can occur in a known way given the inventive component.

As stated in the description of the manufacturing method of this exemplary embodiment, the method steps can occur within the framework of a CMOS process. When, for example, an oxide layer provided for gate electrodes of MOSFETs is also produced in the region of the micromechanical component, this oxide layer can be unproblematically removed together with the auxiliary layer when the cavity 19 is etched. An approximately 400 nm thick polysilicon layer likewise used for the gate electrodes of transistors can, for example, be deposited for the structure layer 7. As described, for example, the auxiliary layer can be produced in a typical thickness of, for example, 650 nm by oxidation of silicon (field oxide).

Electronic components such as, for example, transistors, capacitors, resistors and the like can be simultaneously manufactured next to the region provided for the micromechanical component. The metallization, from which the cover layer 15 is also produced in the example, has a typical thickness of, for example, between 0.5 $\mu$m and 1.5 $\mu$m. For example, AlSiCu or W$\phi$ can be used as metal for the via hole filling. These metals and alloys can also be used for the metallization level (interconnect). It is advantageous when W$\phi$ is used for the supports 12 and webs 11 and AlSiCu is used for the metallization level. It simplifies the manufacture and is therefore expedient when the same metal is used for the via hole filling and the metallization level. Additionally, a barrier 31 can be provided between the metal of the via hole fillings—which advantageously also forms the supports and webs for supporting the cover layer—and the semiconductor material of the substrate (contact region 5 and insulating region 6 of silicon in the example). Such a barrier is composed, for example, of a thin layer of Ti or TiN or of a layer sequence of Ti and TiN having a typical thickness of 5 through 200 nm. A diffusion of the metal into the silicon is thus prevented.

The application of a thin barrier layer on the surface of the cover layer is advantageous, advantageously, for example of said metals. The etching holes 17 are then produced in this barrier layer as well. The barrier layer protects the material of the cover layer (for example, metal) in the subsequent etching of the cavity 19.

For example, photoresist, a nitride (for example, silicon nitride) or a layer sequence of a nitride and photoresist can be used for the mask 18 shown in FIG. 3. Arbitrary materials that are resistant to the etchant to be used for etching the further auxiliary layer out can be used for this mask. The indicated materials can be used for the mask 18 when an oxide layer (for example, silicon oxide) is used as the further auxiliary layer.

When silicon oxide is used for the auxiliary layers, silicon is used for the movable element and metal is used for the cover layer, the etchant that removes the auxiliary layer and the further auxiliary layer selectively relative to the material of the substrate and the material of the cover layer can, for example, be hydrogen fluoride (HF). Hydrogen fluoride can be utilized either wet-chemically as hydrofluoric acid or as buffered hydrofluoric acid or can be utilized as hydrogen fluoride gas or vapor. When using AlSiCu for the metallization, the hydrofluoric acid in the wet-chemical etching can be provided with additives that increase the selectivity of the etching to aluminum. The selectivity to aluminum can also be enhanced with additives when using a buffered hydrofluoric acid solution (BOE, buffered oxide etch). The use of hydrogen fluoride gas is advantageous when an optimally good selectivity to the silicon of the structure layer and the metal of the cover layer should be simultaneously achieved. As mentioned, a cover layer of metal can be additionally protected against the etching attack by applying a thin barrier layer of metal that is more resistant to the etchant.

Silicon oxide or silicon nitride advantageously can be used for the termination layer 21 with which the etching openings 17 in the cover layer 15 are closed and which can also be used as insulating layer between various metallization levels given embodiments wherein the termination layer 21 is composed of a dielectric. For example, this termination layer 21 can be deposited from a plasma.

The inventive component can be provided for arbitrary functions. A pressure-stable cover layer for the movable part can be used for sensors and actuators of a practically arbitrary design. When the termination layer 21 is either foregone or when holes or openings that form a lattice-like or sieve-like structure are provided in the cover layer 15 and in further layers potentially present thereon, this covering can, for example, also be used for pressure sensors. The invention can therefore be realized for arbitrary components wherein a specific function element must be protected against external mechanical influences. The component can then be mounted in a standard housing without requiring further measures. Further possible applications include angular velocity gauges or micromechanical oscillators such as, for example, resonators or filters that oscillate laterally or vertically relative to the substrate.

An electrically conductive cover layer offers particular advantages in case of an acceleration sensor since this cover layer can then be utilized as cooperating electrode. A cooperating electrode at the side of the substrate is then formed, for example, by a doped region 4 as described in the exemplary embodiment as electrode region. Each of these two cooperating electrodes over and under the movable element 8 then forms a respective capacitor together with this element whose capacitance changes when the movable part is deflected in a direction perpendicular to the substrate surface. The changes in these capacitances can be identified in that voltages are applied between the movable element and a respective cooperating electrode, and the currents flowing when a change in the capacitance occurs are used in an evaluation unit for identifying the capacitance. On the basis of a corresponding modification of the applied voltages, it is also possible to electrostatically prevent an excursion of the movable part and simultaneously identify the influencing inertial force from the height of the voltage modification required therefor. The inventive component is, therefore, especially suitable for acceleration sensors since the pressure-stable cover layer can be simultaneously utilized as upper cooperating electrode.

The spacing between the upper side of the substrate 1 and the cover layer 15, i.e. the height of the cavity 19, should not be dimensioned too large in order to assure an adequate mechanical stability of the arrangement formed by the cover layer 15 and the webs 11 or supports 12. An inventively realized acceleration sensor should therefore be of such a nature that the excursions of the movable part are kept as small as possible in a vertical direction in the provided range of measurement. It is desirable for a capacitative evaluation of excursions of the movable part as a result of an influencing inertial force when the movable part—fashioned fashioned layer-like—deforms as little as possible and remains planar insofar as possible. To this end, it is expedient when the stays 9 are fashioned such that an optimally soft suspension of the element 8 is established. The resilient effect of the stays 9 should, therefore, be as great as possible (low "spring constant"). Given a suspension that is not especially taut, i.e. a soft suspension of the movable element 8, the element can oscillate up and down as a whole largely deformation-free, even when it is composed of an extremely thin layer. A soft suspension of the movable element 8 also yields a relatively high sensitivity of the sensor. Such a suspension is best achieved in that the stays 9 are structured meandering.

Examples of the structuring of the structure layer 7 are shown in plan view in FIGS. 7–10. Movable element 28 is respectively secured to stays 29 that are in turn secured to suspension surfaces 30. These suspension surfaces 30 are firmly joined to the substrate 1. In the exemplary embodiment of FIG. 5, the suspension surfaces 30 are located directly on the auxiliary layer 2. However, the suspension surfaces 30 can also be secured to other parts of the substrate 1 or of a layer structure applied thereon. Eight suspension surfaces 30 are present in the example of FIG. 7. Each is connected to a corner of the movable element 28 via a stay 29. Two of the stays 29, which are aligned on a straight line in one of two directions perpendicular to one another, end at each corner of the element 28. This suspension of the movable element 28 is relatively stiff such that the element 28 sags comparatively greatly given an excursion perpendicular to the plane of the drawing.

The structure that is shown in FIG. 8 represents an improvement. Here, the stays 29 are structured as meanders having two sections conducted parallel to the edge of the element 28. Given an appropriate selection of the spacing between the suspension surfaces 30 and the movable element 28, a suspension of the element 28 that largely prevents a sagging of the element can be achieved in this way. Here, too, the stays 29 end at the corners of the element 28. The manner in which the embodiment of FIG. 8 can be realized with only four (instead of eight) suspension surfaces 30 is shown in the exemplary embodiment of FIG. 9. However, the spacing between the movable element 28 and the suspension surfaces 30 is already defined by the spacing of the parts of the stays 29 from one another. The degrees of freedom in the adaptation of the dimensions are thereby somewhat restricted compared to the structure of FIG. 8.

Figure 10:
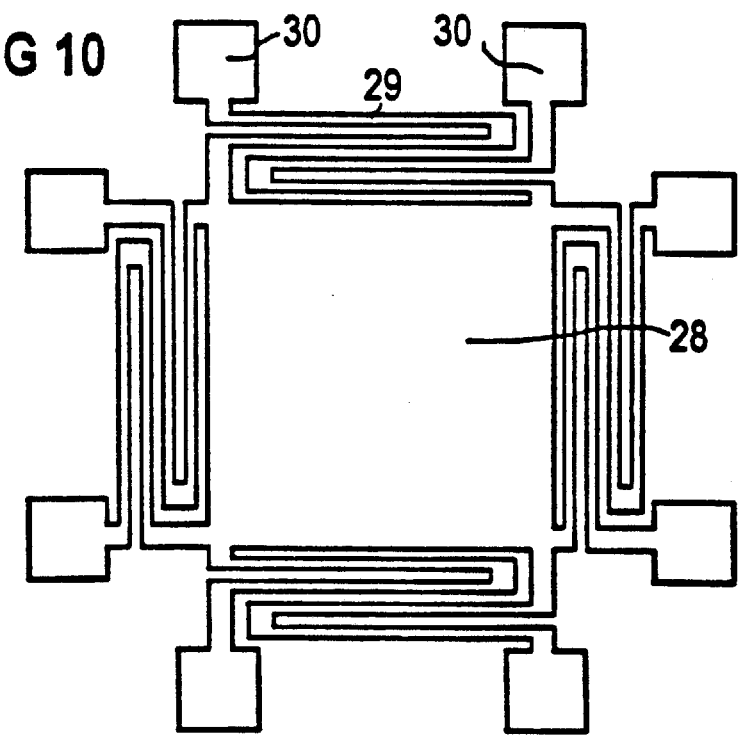

Another embodiment according to FIG. 10 has a larger spacing between the suspension surfaces 30 and the movable element 28. In this embodiment, it is possible to provide those parts of the stays 29 guided parallel to the edges of the movable element 28 significantly longer, which leads to a softer suspension of the element 28.

Figure 9:
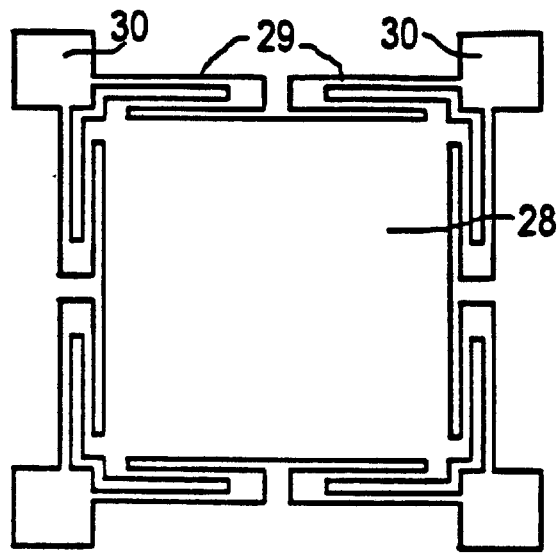

The meandered stays 29 of the examples of FIGS. 8–10 have the advantage that a uniform stress occurring in the structure layer 7 is relaxed, and the sensitivity of the sensor to accelerations in the plane of the drawing is minimized. Further, the space requirements for the stays 29 are reduced. The fastening of the stays 29 to the corners of the movable element 28 has the advantage, among others, that the web 11 surrounding the cavity 19 need be interrupted only at the corners and can therefore represent an effective protective wall for the etching process. The movable element 28 can also be adapted to the arrangement of the webs 11 or supports 12 in a suitable way. The element can comprise an arbitrary geometrical shape in plan view and has been respectively shown quadratic or rectangular in the Figures only for the sake of simplicity.

It is also possible to provide the webs 11 provided for the support of the cover layer 15 in the inside of the cavity or to apply only pillar-like supports 12 to the walls of the cavity 19. For example, when a movable part is oblong, the webs 11 need be present only at narrow sides of the cavity 19. In the embodiment of FIG. 4, for example, the three supports 12 that are shown at the right side lying behind one another on a straight line can be replaced by a continuous web 11. A cover layer 15 of metal can, for example, be structured such that—in addition to the portion shown in the Figures—a portion of this cover layer 15 provided as terminal contact is present outside the region shown in FIG. 4. The first metallization level can also be structured such that, for example, the cover layer 15 formed as a result thereof laterally merges into interconnects.

Figure 11:
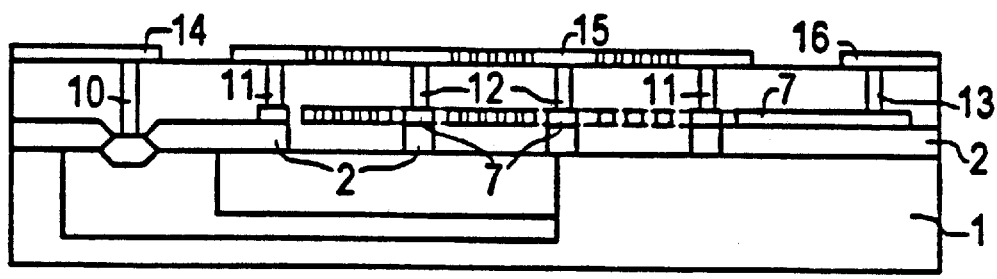
FIG. 11 illustrates shows an alternative embodiment of the inventive component in crossection.

FIG. 11 shows an alternative embodiment of the sensor wherein the webs 11 and supports 12 do not rest on the semiconductor material of the substrate or on a layer structure applied thereon but on portions of the structure layer 7 that are still present. This embodiment is produced, for example, in that the auxiliary layer 2 remains only in the contact regions 5 provided for the electrical connection. The structure layer 7 is applied on a continuous surface of the auxiliary layer 2 and is structured. In this structuring, small portions separated from the rest of the structure layer 7 remain at the locations at which webs 11 or supports 12 are provided. These portions are thus separated from the movable element 8, the stays 9 and the remaining portion of the structure layer 7 provided for anchoring the element 8 on the substrate. The cavity 19 under the cover layer 15 to be manufactured as described is then etched out selectively relative to the material of the cover layer 15 and the material of the structure layer 7, whereby, however, the duration of the etching is limited such that adequately large, remaining portions of the auxiliary layer 2 remain in place under the webs 11 or supports 12.

In the example illustrated in FIG. 11, thus, the supports are formed by a lower, remaining portion of the auxiliary layer 2, an insulated portion of the structure layer 7 situated thereon and the upper portions fashioned according to the exemplary embodiment of FIG. 5 that, for example, can be formed of metal corresponding to a via hole filling. The etching of the cavity here can also occur after the manufacture of the cover layer 15, corresponding to FIG. 3, or be delayed until the end of the overall process, corresponding to FIG. 6. The insulated portions of the structure layer 7 that form a part of the supports 12 must potentially be dimensioned such that the duration of the etching process remains adequately uncritical in order avoid too extensive a removal of the auxiliary layer 2 under these portions and, thus, an inadequate mechanical stability of the support of the cover layer 15. In alternative embodiments, the doped regions in the substrate 1 can also be omitted here or can be differently structured.

In all embodiments that have been shown, it is possible to relax a stress occurring in the applied cover layer 15 by producing further recesses or holes in addition to the etching holes provided for producing the cavity (see, for example, FIG. 2, etching holes 17) in the cover layer 15. The further recesses or holes are capable of being covered as needed by the termination layer 21 to be subsequently applied or by a passivation of the surface. Given a pressure sensor according to the present invention, the openings in the cover layer 15 remain open in order to enable the external pressure to be measured to act on the sensor element. In alternative embodiments, the cover layer can be manufactured as a component part of the second or a higher metallization level when, despite the great spacing from the substrate 1, an adequate mechanical stability of the supports can be achieved.

Although other modifications and changes may be suggested by those skilled in the art, it is the intention of the inventors to embody within the patent warranted hereon all changes and modifications as reasonably and properly come within the scope of their contribution to the art.

We claim:

1. A method for manufacturing a micromechanical semiconductor component having a movable element with a mobility range on a substrate, the method comprising the steps of:

a) producing an auxiliary layer of a material suitable for a subsequent etching at an upper side of the substrate;

b) applying a structure layer provided for the movable element and structuring the structure layer using a mask, the structuring including producing etching holes in the structure layer;

c) covering the structure layer with a further auxiliary layer of a material suitable for the subsequent etching;

d) producing openings in the further auxiliary layer using a mask;

e) filling said openings with material to form a support means;

f) depositing and structuring a cover layer, the structuring including producing etching holes in the cover layer; and g) performing an etching using the etching holes in the cover layer and in the structure layer to remove material of the auxiliary layer and the further auxiliary layer to such an extent to produce a cavity to accommodate the mobility range of the movable element.

2. The method according to claim 1, wherein the step of producing the auxiliary layer is performed such that region provided for the support means remains free of the auxiliary layer.

3. The method according to claim 1, further comprising the steps of:

producing via holes to provide subsequent electrical connection; and filling the via holes with metal.

4. The method according to claim 1, further comprising the steps of:

depositing metal to structure the cover layer; and depositing metallizations for contacts or interconnects together with the cover layer.

5. A method according to claim 1, further comprising the step of:

producing a barrier layer adjacent to semiconductor material of the substrate.

6. A method according to claim 1, further comprising the step of:

providing elastic stays constructed and arranged to secure the movable element to the substrate.

7. The method according to claim 6, wherein the elastic stays are constructed in a meandering arrangement.

8. The method according to claim 1, further comprising the step:

providing a support means applied on a portion of the structure layer.

* * * * *